(12) United States Patent
Joo et al.

(10) Patent No.: US 12,538,803 B2
(45) Date of Patent: Jan. 27, 2026

(54) SEMICONDUCTOR PACKAGE INCLUDING A BARRIER STRUCTURE COVERING CONNECTION PADS AND CONTACTING A PROTRUDING PORTION OF AN ADHESIVE LAYER

(71) Applicant: SAMSUNG ELECTRONICS CO., LTD., Suwon-si (KR)

(72) Inventors: Changeun Joo, Cheonan-si (KR); Eunkyoung Choi, Hwaseong-si (KR); Ohguk Kwon, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 486 days.

(21) Appl. No.: 18/064,241

(22) Filed: Dec. 9, 2022

(65) Prior Publication Data
US 2023/0187380 A1    Jun. 15, 2023

(30) Foreign Application Priority Data
Dec. 10, 2021    (KR) .......................... 10-2021-0176397

(51) Int. Cl.
*H01L 23/00*    (2006.01)
*H01L 23/31*    (2006.01)
*H01L 23/48*    (2006.01)

(52) U.S. Cl.
CPC ........ *H01L 23/562* (2013.01); *H01L 23/3157* (2013.01); *H01L 23/481* (2013.01);
(Continued)

(58) Field of Classification Search
CPC ............. H01L 23/3128; H01L 23/3157; H01L 23/481; H01L 21/561; H01L 25/18;
(Continued)

(56) References Cited

U.S. PATENT DOCUMENTS 8,994,155 B2    3/2015 Tsai et al.
9,054,228 B2 *  6/2015 Choi ........................ H01L 24/97
(Continued)

FOREIGN PATENT DOCUMENTS

JP      2011114086      6/2011
KR   10-2008-0065871    7/2008

*Primary Examiner* — Khiem D Nguyen
(74) *Attorney, Agent, or Firm* — Morgan, Lewis & Bockius LLP

(57) ABSTRACT

A semiconductor package includes a first semiconductor chip having a first surface and a second surface. First connection pads are adjacent to the first surface. A second semiconductor chip has a lower surface facing the first surface of the first semiconductor chip and includes second connection pads, Connection bumps contact the first connection pads and the second connection pads between the first semiconductor chip and the second semiconductor chip. An adhesive layer is interposed between the first semiconductor chip and the second semiconductor chip to at least partially surround the connection bumps. The adhesive layer includes a protruding portion protruding from a side surface of the second semiconductor chip. A barrier structure covers a portion of the first connection pads, partially overlapping the second semiconductor chip on the first surface, and contacting the protruding portion of the adhesive layer.

20 Claims, 17 Drawing Sheets

(52) U.S. Cl.
CPC ............. *H01L 24/16* (2013.01); *H01L 24/29* (2013.01); *H01L 24/32* (2013.01); *H01L 24/73* (2013.01); *H01L 2224/16145* (2013.01); *H01L 2224/26125* (2013.01); *H01L 2224/32145* (2013.01); *H01L 2224/73204* (2013.01)

(58) Field of Classification Search
CPC ........... H01L 25/50; H01L 2224/16145; H01L 2224/26125; H01L 2225/06513; H01L 2225/06517; H01L 2225/06541; H01L 24/16; H01L 24/29; H01L 24/32; H01L 24/73; H01L 2224/32145
See application file for complete search history.

(56) References Cited

U.S. PATENT DOCUMENTS

| | | | |
|---|---|---|---|
| 9,391,025 B2 * | 7/2016 | Karhade | H01L 25/0657 |
| 10,497,676 B2 | 12/2019 | Kwak et al. | |
| 10,515,827 B2 * | 12/2019 | Jeng | H01L 23/49822 |
| 2014/0291854 A1 * | 10/2014 | Lee | H01L 23/481 |
| | | | 257/774 |
| 2014/0299980 A1 | 10/2014 | Choi et al. | |
| 2015/0179614 A1 * | 6/2015 | Murai | H01L 25/50 |
| | | | 257/784 |
| 2021/0111160 A1 * | 4/2021 | Kim | H01L 23/3128 |
| 2021/0134761 A1 * | 5/2021 | Oh | H01L 25/50 |
| 2021/0143008 A1 | 5/2021 | Ko et al. | |

* cited by examiner

SEMICONDUCTOR PACKAGE INCLUDING A BARRIER STRUCTURE COVERING CONNECTION PADS AND CONTACTING A PROTRUDING PORTION OF AN ADHESIVE LAYER

CROSS-REFERENCE TO RELATED APPLICATION(S)

This application claims priority to Korean Patent Application No. 10-2021-0176397 filed on Dec. 10, 2021 in the Korean intellectual Property Office, the disclosure of which is herein incorporated by reference in its entirety.

TECHNICAL FIELD

The present inventive concept relates to a semiconductor package and, more specifically, to a semiconductor package including a barrier structure.

DISCUSSION OF THE RELATED ART

Research and development for increasing reliability of a semiconductor package in which semiconductor chips are stacked are continuously being conducted. The reliability of the semiconductor package may be affected by a connection state of connection bumps and interconnection layers. To ensure the reliability of the semiconductor package, a technology capable of preventing the occurrence of cracks in a region between the semiconductor chips may be used.

SUMMARY

A semiconductor package includes a first semiconductor chip having a first surface and a second surface opposite to the first surface. The first semiconductor chip includes first connection pads adjacent to the first surface. A second semiconductor chip has a lower surface facing the first surface of the first semiconductor chip and includes second connection pads. Connection bumps contact the first connection pads and the second connection pads between the first semiconductor chip and the second semiconductor chip. An adhesive layer is interposed between the first semiconductor chip and the second semiconductor chip and at least partially surrounds the connection bumps and includes a protruding portion protruding from a side surface of the second semiconductor chip in an outward direction away from the side surface of the second semiconductor chip. A barrier structure at least partially covers a portion of the first connection pads, partially overlapping the second semiconductor chip on the first surface, and contacting the protruding portion of the adhesive layer.

A semiconductor package includes a first semiconductor chip including a first device layer. The first device layer includes a first interlayer insulating layer, a first interconnection structure, and first connection pads. A second semiconductor chip has a lower surface facing the first device layer of the first semiconductor chip and including second connection pads Connection bumps are disposed between the first semiconductor chip and the second semiconductor chip and electrically connect the first connection pads and the second connection pads to each other. An adhesive layer is interposed between the first semiconductor chip and the second semiconductor chip and at least partially surrounds the connection bumps and contacts the first device layer. A barrier structure contacts the first device layer and the adhesive layer and is spaced apart from the connection bumps and at least partially surrounds regions in which the connection bumps are disposed.

A semiconductor package includes a first semiconductor chip including a first semiconductor layer, a through-via passing through the first semiconductor layer, a first interconnection structure, and first connection pads disposed on an upper surface of the first semiconductor layer and electrically connected to the through-via. A second semiconductor chip is disposed on the first semiconductor chip and includes a second semiconductor layer, a second interconnection structure, and second connection pads. Connection bumps contact the first connection pads and the second connection pads between the first semiconductor chip and the second semiconductor chip. An adhesive layer is interposed between the first semiconductor chip and the second semiconductor chip and at least partially surrounds the connection bumps and includes a protruding portion protruding from a side surface of the second semiconductor chip in an outward direction away from the side surface of the second semiconductor chip. A barrier structure is disposed between one of the first connection pads and the protruding portion of the adhesive layer. The barrier structure includes an overlapping region vertically overlapping the second semiconductor chip and a non-overlapping region not vertically overlapping the second semiconductor chip. An encapsulant covers the barrier structure, the protruding portion of the adhesive layer, and the second semiconductor chip on the first semiconductor chip. The non-overlapping region of the barrier structure extends in an outward direction with respect to the protruding portion of the adhesive layer.

BRIEF DESCRIPTION OF DRAWINGS

The above and other aspects, features, and aspects of the present inventive concept will be more clearly understood from the following detailed description, taken in conjunction with the is accompanying drawings, in which.

DETAILED DESCRIPTION

Hereinafter, example embodiments of the present inventive concept will be described with reference to the accompanying drawings.

Figure 1:
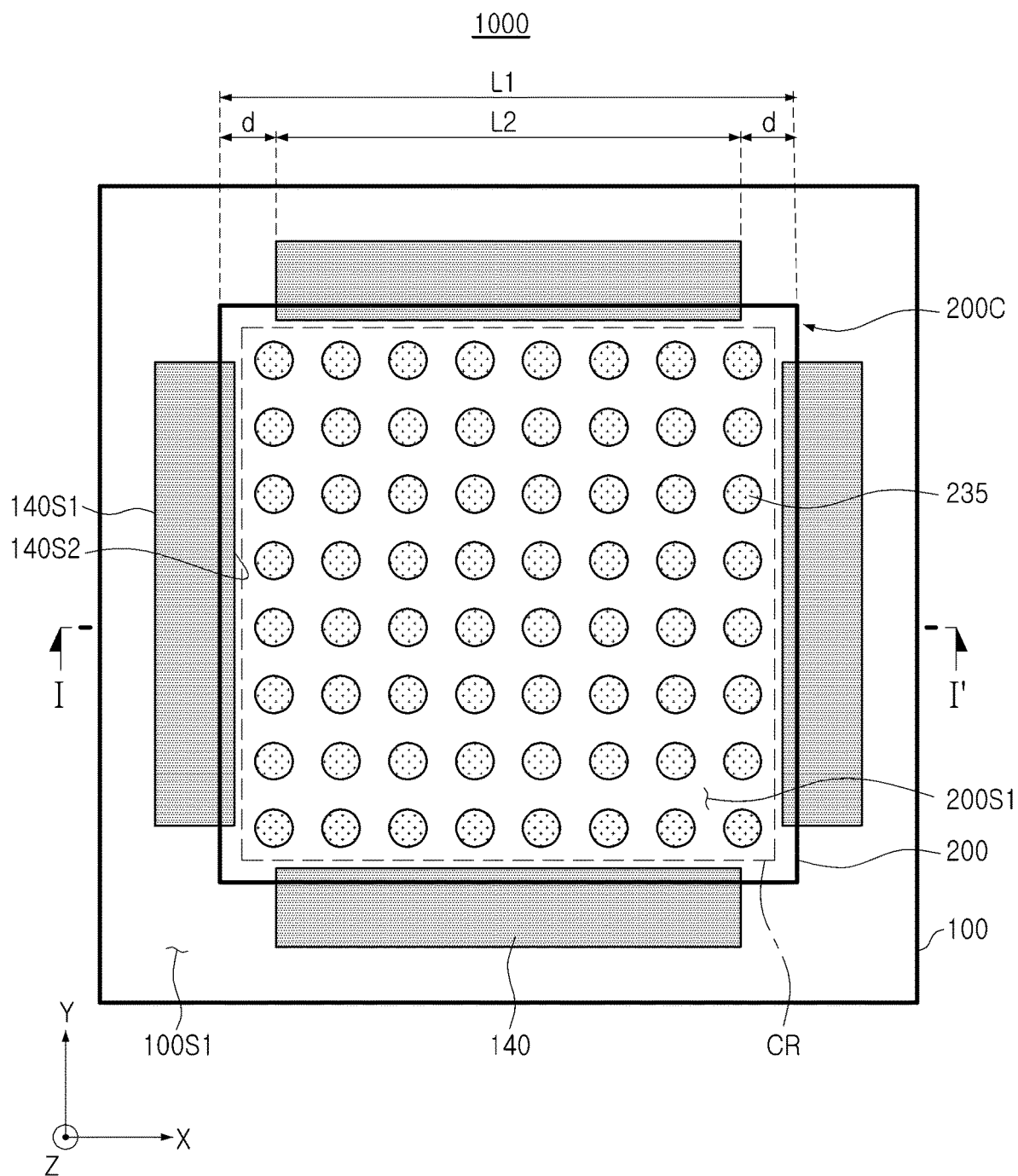
FIG. 1 is a schematic plan view of a semiconductor package according to an embodiment of the present inventive concept.

FIG. 1 is a schematic plan view of a semiconductor package according to an embodiment of the present inventive concept.

Figure 2:
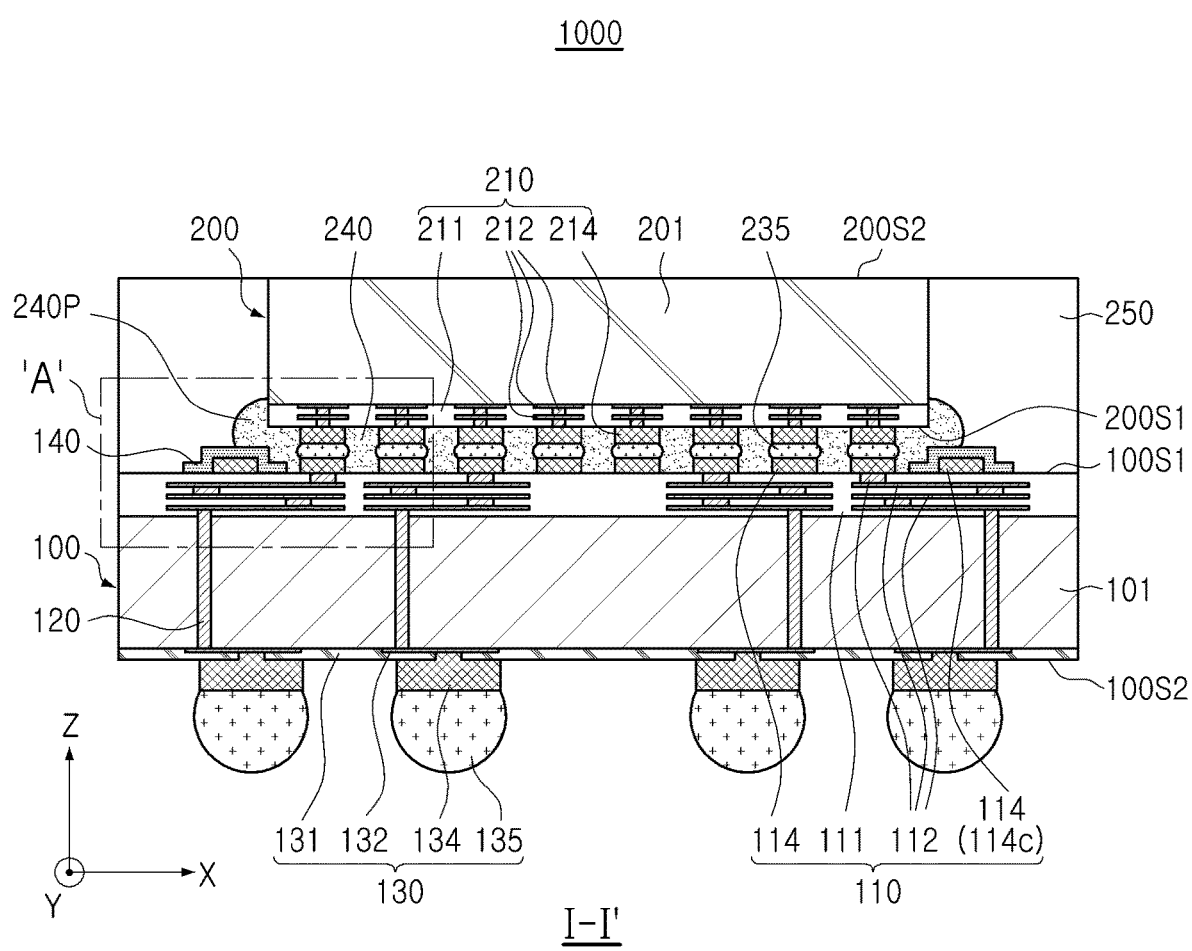
FIG. 2 is a schematic cross-sectional view of a semiconductor package according to an embodiment of the present inventive concept.

FIG. 2 is a schematic cross-sectional view of a semiconductor package according to an embodiment of the present inventive concept. FIG. 2 illustrates a cross-section of the semiconductor package of FIG. 1, taken along line I-I'.

Figure 3A:
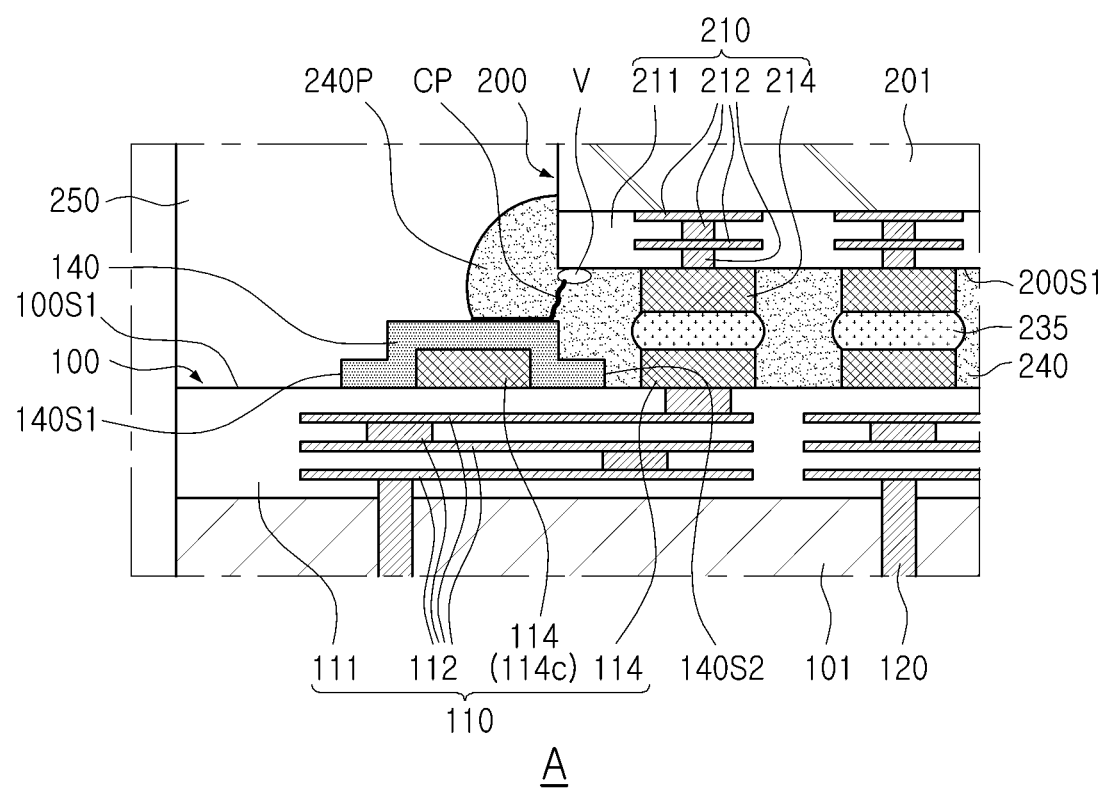
FIGS. 3A and 3B are partially enlarged views illustrating a region of a semiconductor package.
Figure 3B:
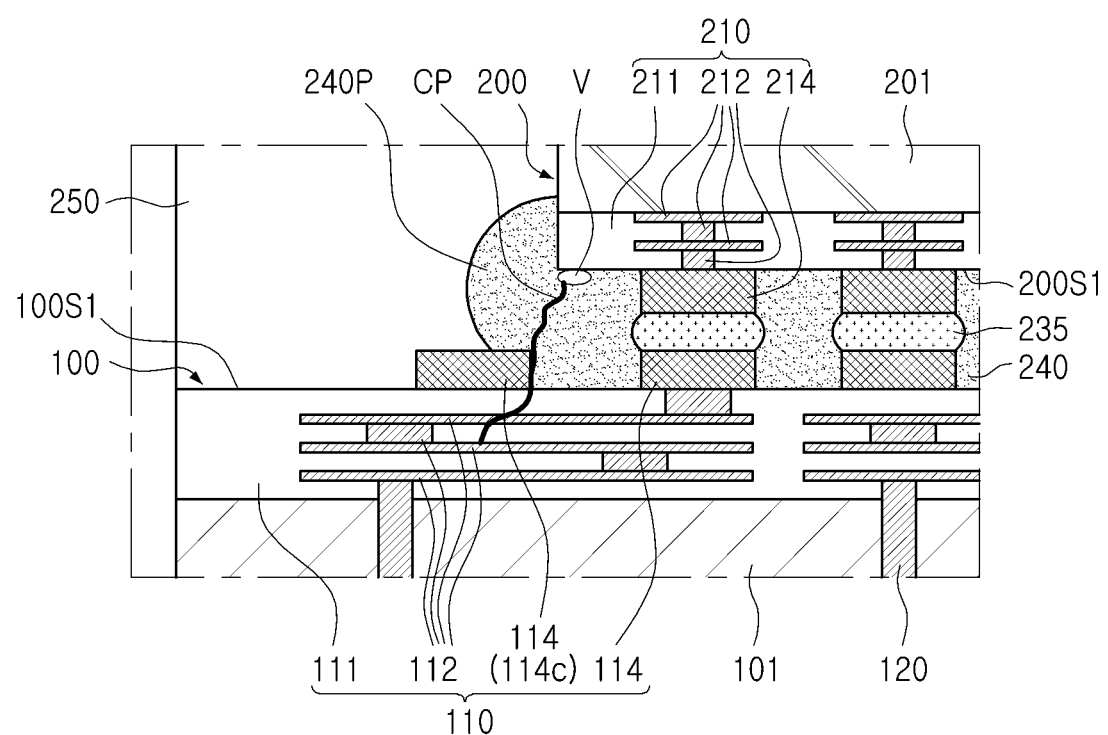

FIGS. 3A and 3B are partially enlarged views illustrating a region of a semiconductor package. FIG. 3A illustrates an enlarged view of portion 'A' of FIG. 2, and FIG. 3B illustrates an enlarged view of a region corresponding to portion 'A' of FIG. 2.

Referring to FIGS. 1 to 3A, a semiconductor package 1000, according to an embodiment of the present inventive concept, may include a first semiconductor chip 100 and a second semiconductor chip 200 on the first semiconductor chip 100. The semiconductor package 1000 may include connection bumps 235 connecting the first semiconductor chip 100 and the second semiconductor chip 200 to each other. An adhesive layer 240 at least partially surrounds the connection bumps 235. A barrier structure 140 contacts the adhesive layer 240. Cracks may occur in voids that may be formed in the adhesive layer 240 due to local stress concentration of a fillet portion 240P of the adhesive layer 240. The barrier structure 140 may prevent these cracks from propagating to a first device layer 110 of the first semiconductor chip 100.

The first semiconductor chip 100 may be a buffer chip or a control chip including a plurality of logic devices and/or a plurality of memory devices in the first device layer 110. The first semiconductor chip 100 may transmit a signal from the second semiconductor chip 200 stacked thereon to an external source, and may also transmit a signal and power from the external source to the second semiconductor chip 200. The first semiconductor chip 100 may include integrated circuits, and may include a circuit for transmitting an address command or a control command such that the second semiconductor chip 200 may store or output data, for example, an input/output (V/O) circuit or the like. For example, the integrated circuits may be configured to perform a logic function and a memory function by the logic devices and the memory devices. According to an embodiment, the logic functions may be performed by the logic devices.

The first semiconductor chip 100 may include a first semiconductor layer 101, a first device layer 110, a first through-via 120, and a first connection structure 130.

The first semiconductor layer 101 may include, for example, a semiconductor element such as silicon (Si) or germanium (Ge), or may include a compound semiconductor such as silicon carbide (SiC), gallium arsenide (GaAs), indium arsenide (InAs), or indium phosphide (InP). The first semiconductor layer 101 may have a silicon-on-insulator (SOI) structure. The first semiconductor layer 101 may include an active region, for example, a well doped with an impurity or a structure doped with an impurity. The active region may be formed on a surface of the semiconductor layer 101 that is adjacent to a first surface 100S1 of the first semiconductor chip 100. The first semiconductor layer 101 may include various device isolation structures such as a shallow trench isolation (STI) structure. The first semiconductor layer 101 may have an active surface having the active region and an inactive surface located opposite to the active surface.

The first device layer 110 may include various types of devices disposed on an upper surface (e.g., the active surface) of the first semiconductor layer 101 adjacent to the first surface 100S1 of the first semiconductor chip 100. The devices may be disposed on the active region of the first semiconductor layer 101, and may include various active devices and/or passive devices. For example, the first device layer 110 may include various active devices and/or passive devices, for example, a field effect transistor (FET) such as a planar FET, FinFET, or the like, a memory device such as a flash memory, a dynamic random access memory (DRAM), a static random access memory (SRAM), an electrically erasable programmable read-only memory (EEPROM), a phase-change random access memory (PRAM), a magnetoresistive random access memory (MRAM), a ferroelectric random access memory (FeRAM), resistive random access memory (RRAM) or the like, logic devices such as AND, OR, NOT, or the like, a system large scale integration (LSI), a CMOS imaging sensor (CIS), or a micro-electro-mechanical system (MEMS).

The first device layer 110 may include a first interlayer insulating layer 111 at least partially covering the devices, a first interconnection structure 112, and first connection pads 114.

The first interlayer insulating layer 111 may include silicon oxide, silicon nitride, silicon oxynitride, or tetraethylorthosilicate (TEOS). The first interlayer insulating layer 111 may include a photosensitive resin such as a photoimageable dielectric (PID) resin. The first interlayer insulating layer 111 may include a plurality of layers. An insulating protective layer for electrically separating the first interconnection structure 112 from the first semiconductor layer 101 may be disposed between the first device layer 110 and the first semiconductor layer 101.

The first interconnection structure 112 may connect the devices of the first device layer 110, may connect the devices to the active region of the first semiconductor layer 101, or may electrically connect the devices to the connection bumps 235. The first interconnection structure 112 may include, for example, a metal material such as copper (Cu), aluminum (Al), silver (Ag), tin (Sn), gold (Au), nickel (Ni), lead (Pb), or titanium (Ti), a nitride of the metal material, or an alloy of the metal materials. The first interconnection structure 112 may have a multi-layered structure including a first interconnection layer and a first via. The first via may be disposed between first interconnection layers disposed on different levels and may electrically connect the various interconnection layers to each other.

The first connection pads 114 may be disposed adjacent to the first surface 100S1 of the first semiconductor chip 100, and may be electrically connected to the first interconnection structure 112. The first connection pads 114 may include, for example, a metal material such as copper (Cu), aluminum (Al), silver (Ag), tin (Sn), gold (Au), nickel (Ni), lead (Pb), or titanium (Ti), a nitride of the metal material, or an alloy of the metal materials. The first connection pads 114 may protrude from an uppermost first interlayer insulating layer 111 among the first interlayer insulating layers 111, but the present inventive concept is not necessarily limited thereto. A portion of the first connection pads 114 may be in contact with the connection bumps 235 and the adhesive is layer 240, and other portions of the first connection pads 114 may be in contact with the barrier structure 140 and may be spaced apart from the adhesive layer 240. For example, among the first connection pads 114, first connection pads 114c closest to an outer edge of the first semiconductor chip 100 may be in contact with the barrier structure 140, and may be spaced apart from connection bumps 235 and the adhesive layer 240.

The first through-via 120 may be a through-silicon via (TSV), may pass through the first semiconductor layer 101 in a vertical direction (a Z-axis direction), and may provide an electrical path connecting the first interconnection structure 112 to the first connection structure 130. The first through-via 120 may include an insulating spacer layer and a conductive layer. The conductive layer may include a conductive plug and a barrier layer at least partially surrounding the conductive plug. The first through-via 120 may be, for example, formed as a via-last structure, but is not necessarily limited thereto, and may be formed as a via-middle structure or a via-first structure. The via-first structure may refer to a structure in which the first through-via 120 is first formed before forming the individual devices of the device layer 110, the via-middle structure may refer to a structure in which the first through-via 120 is formed after forming the individual devices, and the via-last structure may refer to a structure in which the first through-via 120 is formed after entirely forming the first interconnection structure 112.

The first connection structure 130 may be disposed below a lower surface (e.g., the inactive surface) of the first semiconductor layer 101. The first connection structure 130 may include a first interconnection pattern 132 connected to the first through-via 120, a first passivation layer 131 at least partially covering the first interconnection pattern 132, a pillar bump 134 passing through the first passivation layer 131 and connected to the first interconnection pattern 132, and a lower connection bump 135 connected to the pillar bump 134.

The barrier structure 140 may be disposed on the first surface 100S1 of the first semiconductor chip 100 and may cover a portion of the first connection pads 114 (e.g., the first connection pad 114c) and the uppermost first interlayer insulating layer 111, among the first is interlayer insulating layers 111. The barrier structure 140 may separate the portion of the first connection pads 114 (e.g., the first connection pad 114c) from the fillet portion 240P of the adhesive layer 240. The barrier structure 140 may include a bent portion, bent from a portion covering an upper surface of the portion of the first connection pads 114 (e.g., the first connection pad 114c) to a portion covering a side surface of the portion of the first connection pads 114 (e.g., the first connection pad 114c). The barrier structure 140 may be partially disposed below the fillet portion 240P of the adhesive layer 240. The barrier structure 140 may be disposed on a level that is lower than a lower surface 200S1 of the second semiconductor chip 200.

The adhesive layer 240 may include the fillet portion 240P (or may be referred to as a 'protruding portion') formed by protruding from a region between the first semiconductor chip 100 and the second semiconductor chip 200 by a thermocompression process. As illustrated in FIGS. 3A and 3B, when a void V is formed in the adhesive layer 240 due to local stress concentration of the fillet portion 240P, a crack CP may occur from the void V. In a structure in which the first device layer 110 of the first semiconductor chip 100 is disposed below the adhesive layer 240, when there is no barrier structure 140 as illustrated in FIG. 3B, a crack CP may propagate along a boundary between the first connection pad 114c and the adhesive layer 240 and may face downward from the first device layer 110, to cause a crack defect in the first interlayer insulating layers 111 of the first device layer 110 or the first interconnection structure 112.

According to an embodiment of the present inventive concept, as illustrated in FIG. 3A, the barrier structure 140 may be disposed between the fillet portion 240P of the adhesive layer 240 and the first connection pads 114c, to prevent the crack CP generated from the void V from propagating toward the first connection pads 114c and the first device layer 110 therebelow. The crack CP may propagate along the interface between the barrier structure 140 and the adhesive layer 240, but the propagation may be stopped near an encapsulant 250. Therefore, even when the void V is formed in the adhesive layer 240 and the crack CP occurs, damage to the first device layer 110 due to propagation of the crack CP may be prevented, and thus reliability of the is semiconductor package 1000 may be increased.

Since the barrier structure 140 may be spaced apart from the connection bumps 235, the barrier structure 140 might not directly affect the connection bumps 235. The barrier structure 140 may at least partially surround a region CR in which the connection bumps 235 are disposed in a plan view, e.g., at least a portion of a central region of the lower surface 200S1 of the second semiconductor chip 200. For example, the barrier structure 140 may include barrier patterns extending along respective sides of the lower surface 200S1 of the second semiconductor chip 200. The barrier patterns may be spaced apart from each other in a region below a corner 200C of the second semiconductor chip 200. In the region below the corner 200C of the second semiconductor chip 200, the fillet portion 240P of the adhesive layer 240 may be weakly formed, such that the encapsulant 250 may be unfilled. The various barrier structures 140 may be spaced apart from each other to provide a space. The encapsulant 250 may be completely filled even in a region in which the fillet portion 240P is weakly formed.

One side of the lower surface 200S1 of the second semiconductor chip 200 may have a first length L1, and the barrier pattern of the barrier structure 140 may extend along the one side of the lower surface 200S f of the second semiconductor chip 200, and may have a second length L2 that is shorter than the first length L1. The second length L2 may be in a range of about 0.8 times to about 0.9 times the first length L1. The second length L2 may be shorter than the first length by twice a separation distance d. For example, when the first length L1 is about 9.66 mm, the separation distance d may be about 0.75 mm. A thickness of the barrier structure 140 may range from about 1 μm to about 15 μm, preferably from about 3 μm to about 5 μm. When the thickness of the barrier structure 140 is less than the above range, a crack propagation prevention effect may be reduced. When the thickness of the barrier structure 140 is greater than the above range, formation of the fillet portion 240P of the adhesive layer 240 might be difficult, and the second semiconductor chip 200 might not be properly fixed.

The barrier structure 140 may at least partially overlap the second semiconductor chip 200. For example, the barrier structure 140 may include an overlapping region overlapping the second semiconductor chip 200 in the Z direction, and a non-overlapping region that does not overlap the second semiconductor chip in the Z direction. The non-overlapping region may extend in an outward direction, with respect to the fillet portion 240P of the adhesive layer 240. The barrier structure 140 may have an outer sidewall 140S1 and an inner sidewall 140S2 in a plan view (refer to FIG.

1). The outer sidewall 140S1 may be disposed in an outward direction, with respect to the fillet portion 240P of the adhesive layer 240. The outer sidewall 140S1 may be disposed in an outward direction, with respect to a side surface of the semiconductor chip 200. The outer sidewall 140S1 may be disposed in an inward direction, with respect to a side surface of the first semiconductor chip 100. The inner sidewall 140S2 may overlap the second semiconductor chip 200.

The barrier structure 140 may be formed of a photosensitive material such as a photoimageable dielectric (PID) or photo-sensitive polyimide (PSPI). The barrier structure 140 may include a material having a lower modulus of elasticity than the adhesive layer 240.

The second semiconductor chip 200 may be disposed on the first semiconductor chip 100. The second semiconductor chip 200 may include a second semiconductor layer 201 and a second device layer 210. The second semiconductor chip 200 may be stacked in a face-to-face manner such that the second device layer 210 faces the first device layer 110 of the first semiconductor chip 100, but the present inventive concept is not necessarily limited thereto. A first surface 200S1, the lower surface of the semiconductor chip 200, may face the first surface 100S1 of the first semiconductor chip 100. Unlike the first semiconductor chip 100, the second semiconductor chip 200 might not include a through-via, but the present inventive concept is not necessarily limited thereto.

The second semiconductor layer 201 may include the same or similar material as the first semiconductor layer 101. The second semiconductor layer 201 may have a smaller size than the first semiconductor layer 101, but the present inventive concept is not necessarily limited thereto.

The second device layer 210 may include second integrated circuits disposed below a lower surface (e.g., the active surface) of the second semiconductor layer 201. The second integrated circuits may include memory devices that store and/or output data based on an address command, a control command, and the like received from the first semiconductor chip 100. For example, the memory devices may include volatile memory devices such as a DRAM and an SRAM, or non-volatile memory devices such as a PRAM, an MRAM, an FeRAM, or an RRAM. In this case, semiconductor packages, according to embodiments of the present inventive concept, may be used in a high bandwidth memory (HBM) product, an electro data processing (EDP) product, or the like.

The second device layer 210 may include a second interlayer insulating layer 211, a second interconnection structure 212, and second connection pads 214.

The second interlayer insulating layer 211 may include the same material as the first interlayer insulating layer 111. The second interlayer insulating layer 211 may include a plurality of layers.

The second interconnection structure 212 may have a multi-layered structure including a second interconnection layer and a second via. The second interconnection structure 212 may include, for example, a metal material such as copper (Cu), aluminum (Al), silver (Ag), tin (Sn), gold (Au), nickel (Ni), lead (Pb), or titanium (Ti), a nitride of the metal material, or an alloy of the metal materials.

The second connection pads 214 may be disposed below the first surface 200S1 of the second semiconductor chip 200, and may be electrically connected to the second interconnection structure 212. The second connection pads 214 may include, for example, a metal material such as copper (Cu), aluminum (Al), silver (Ag), tin (Sn), gold (Au), nickel (Ni), lead (Pb), or titanium (Ti), a nitride of the metal material, or an alloy of the metal materials.

The connection bumps 235 may be in contact with the first connection pads 114 and the second connection pads 214 between the first semiconductor chip 100 and the second semiconductor chip 200. The connection bumps 235 may include bumps for communication with an external device (e.g., '800' in FIG. 9), in addition to bumps for communication between the first semiconductor chip 100 and the second semiconductor chip 200. The connection bumps 235 may include a low-melting-point metal, or, for example, an alloy including tin (Sn) (e.g., Sn—Ag—Cu) or another metal having a melting point that is the same as or lower than that of one or more of the forgoing. The connection bumps 235 may include, for example, tin (Sn), indium (In), bismuth (Bi), antimony (Sb), copper (Cu), silver (Ag), zinc (Zn), lead (Pb), and/or an alloy thereof. The alloy may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like. The connection bumps 235 may include, for example, a solder ball. Each of the connection bumps 235 may have a land shape, a ball shape, or a pin shape. Each of the connection bumps 235 may be formed as a multi-layer or a single layer.

The adhesive layer 240 may at least partially surround the connection bumps 235. The adhesive layer 240 may be a non-conductive (e.g., a dielectric) material layer that electrically insulates adjacent connection bumps 235 from each other. The non-conductive material may include an epoxy-based material that does not contain conductive particles, and the adhesive layer 240 may be, e.g., a non-conductive film (NCF). The adhesive layer 240 may include any type of polymer film that may be subjected to a thermocompression process. The adhesive layer 240 may include the fillet portion 240P flowing and protruding from the side surface of the second semiconductor chip 200 in an outward direction. The fillet portion 240P may extend in the X and Y directions from a portion in which the adhesive layer 240 is interposed between the first semiconductor chip 100 and the second semiconductor chip 200. The fillet portion 240P may be in contact with the side surface of the second semiconductor chip 200. The adhesive layer 240 may fix the first semiconductor chip 100 and the second semiconductor chip 200 to maintain a chip stack structure of the semiconductor package. The fillet portion 240P of the adhesive layer 240 may be in contact with the barrier structure 140. The adhesive layer 240 may be in contact with is the first device layer 110, the second device layer 210, and the barrier structure 140.

A semiconductor package 1000, according to an embodiment, may further include an encapsulant 250 at least partially surrounding the side surface of the second semiconductor chip 200 on the first semiconductor chip 100, and covering the fillet portion 240P of the adhesive layer 240, and the barrier structure 140. As illustrated in FIG. 2, the encapsulant 250 may expose the upper surface of the second semiconductor chip 200. In some embodiments, the encapsulant 250 may cover the upper surface of the second semiconductor chip 200. The encapsulant 250 may include, for example, an epoxy mold compound (EMC), but a material of the encapsulant 250 is not necessarily limited to this approach.

Figure 4:
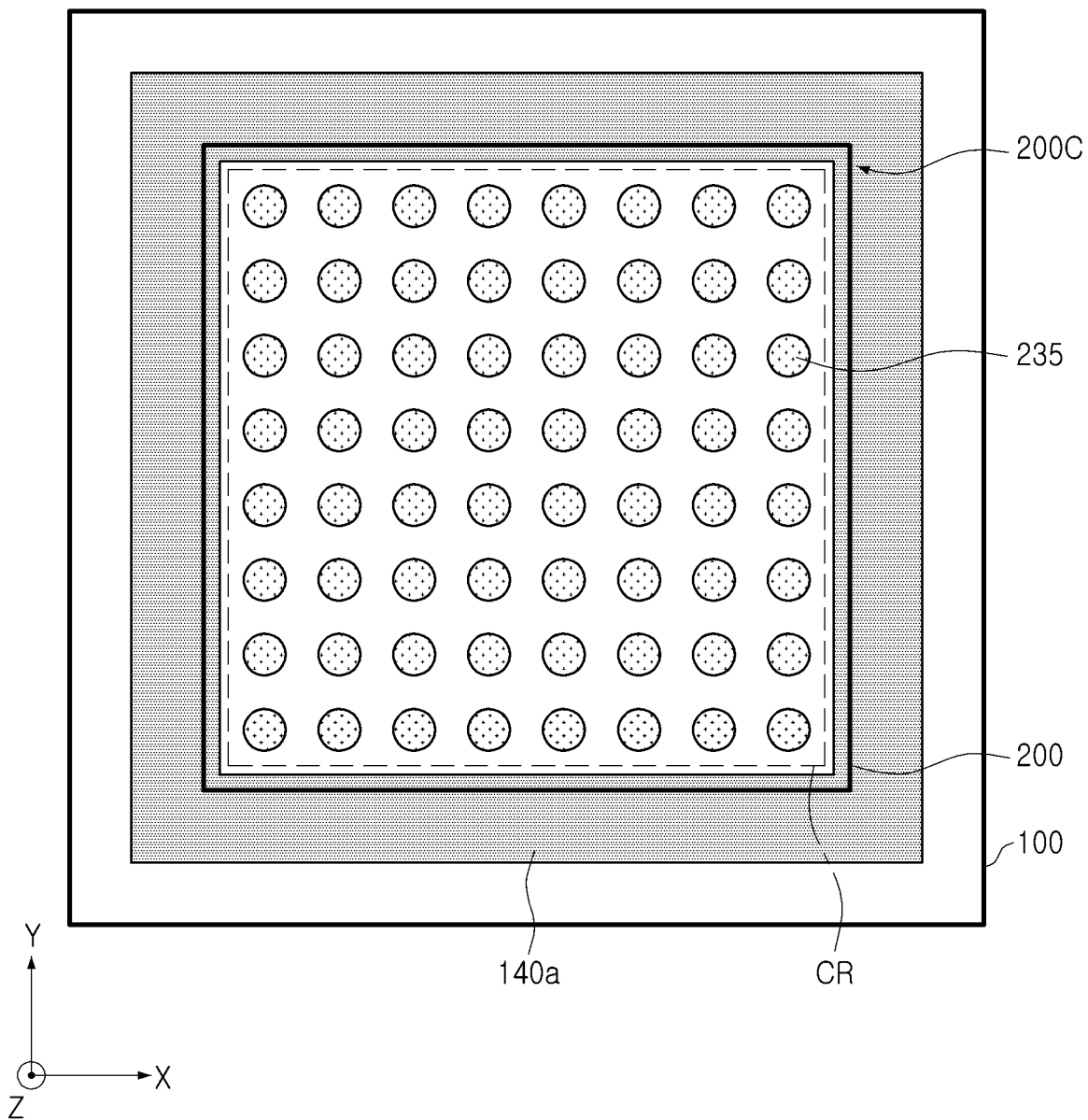
FIG. 4 is a schematic plan view of a semiconductor package according to an embodiment of the present inventive concept.

FIG. 4 is a schematic plan view of a semiconductor package according to an embodiment of the present inventive concept.

Referring to FIG. 4, a semiconductor package 1000A may be similar to the semiconductor package 1000 of FIGS. 1 to 3A, but a barrier structure 140a may have a dam shape completely surrounding a central region CR in which connection bumps 235 are arranged. For example, in a region below a corner 200C of a lower surface 200S1 of a second semiconductor chip 200, the barrier structure 140a might not be disconnected, but may extend continuously. Since the semiconductor package 1000A includes the barrier structure 140a, propagation of a crack CP from a void V formed in an adhesive layer 240 to a first device layer 110 of a first semiconductor chip 100 may be prevented, as described above with reference to FIG. 3A.

Figure 5:
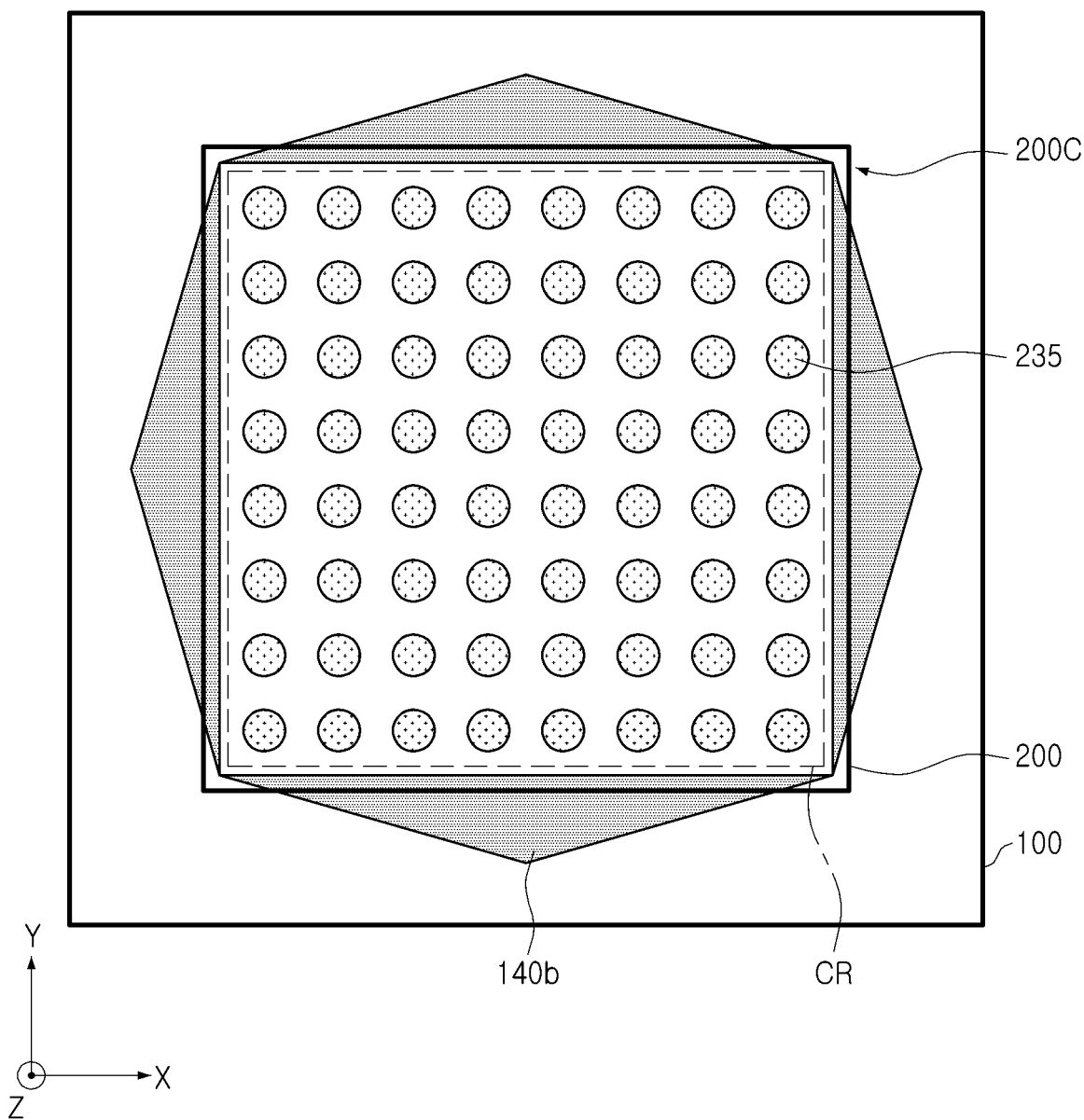
FIG. 5 is a schematic plan view of a semiconductor package according to an embodiment of the present inventive concept.

FIG. 5 is a schematic plan view of a semiconductor package according to an embodiment of the present inventive concept.

Referring to FIG. 5, a semiconductor package 1000B may be similar to the semiconductor package 1000A of FIG. 4, but a barrier structure 140b may have a shape in which a width decreases toward a corner 200C of a lower surface 200S1 of a second semiconductor chip 200. For example, the barrier structure 140b may include a barrier pattern including portions having different widths in one direction.

Figure 6:
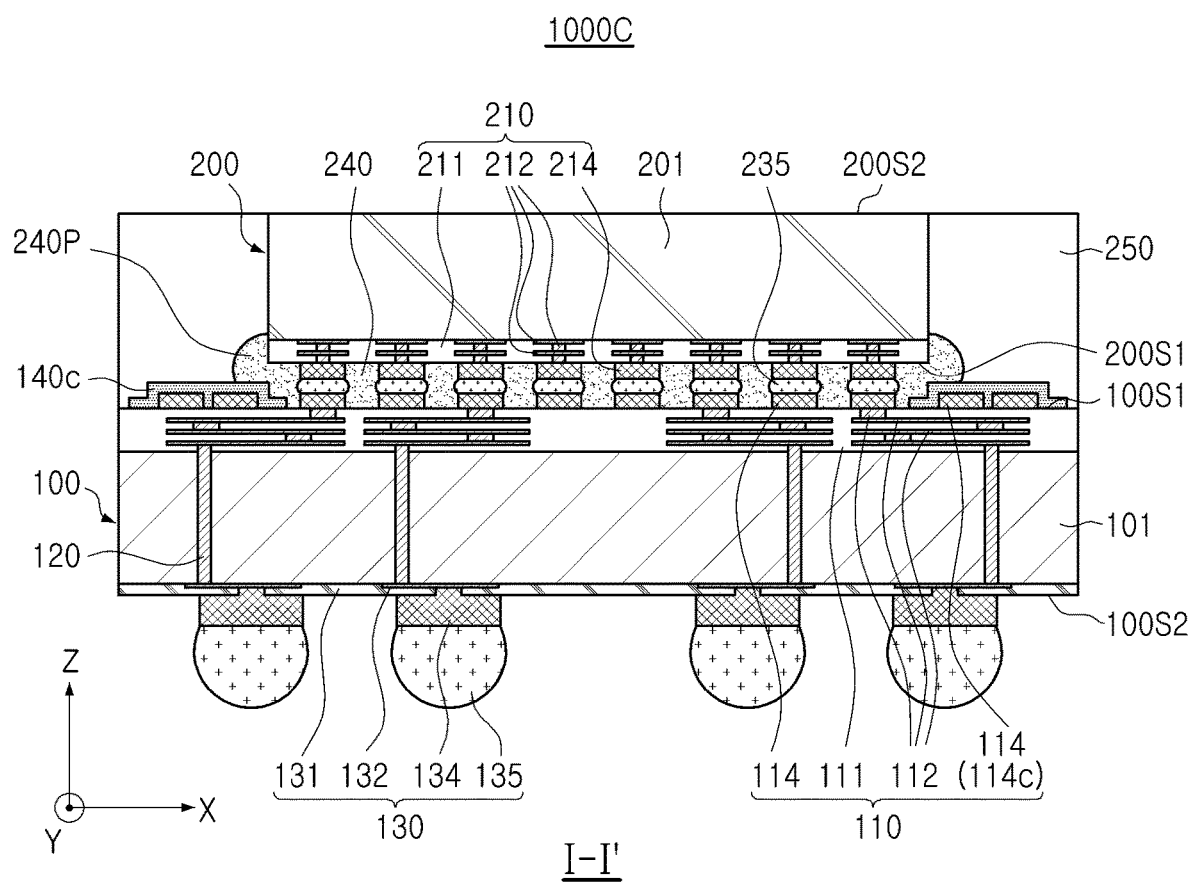
FIG. 6 is a schematic cross-sectional view of a semiconductor package according to an embodiment of the present inventive concept.

FIG. 6 is a schematic cross-sectional view of a semiconductor package according to an embodiment of the present inventive concept.

Referring to FIG. 6, a semiconductor package 1000C may be similar to that of FIGS. 1 to 3A, but a barrier structure 140c may cover a plurality of first connection pads 114c, and may extend longer in the X direction, with respect to the other embodiments. Since the semiconductor package 1000C includes the barrier structure 140c, propagation of a crack CP from a void V formed in an adhesive layer 240 to a first device layer 110 of a first semiconductor chip 100 may be prevented, as described above with reference to FIG. 3A.

Figure 7:
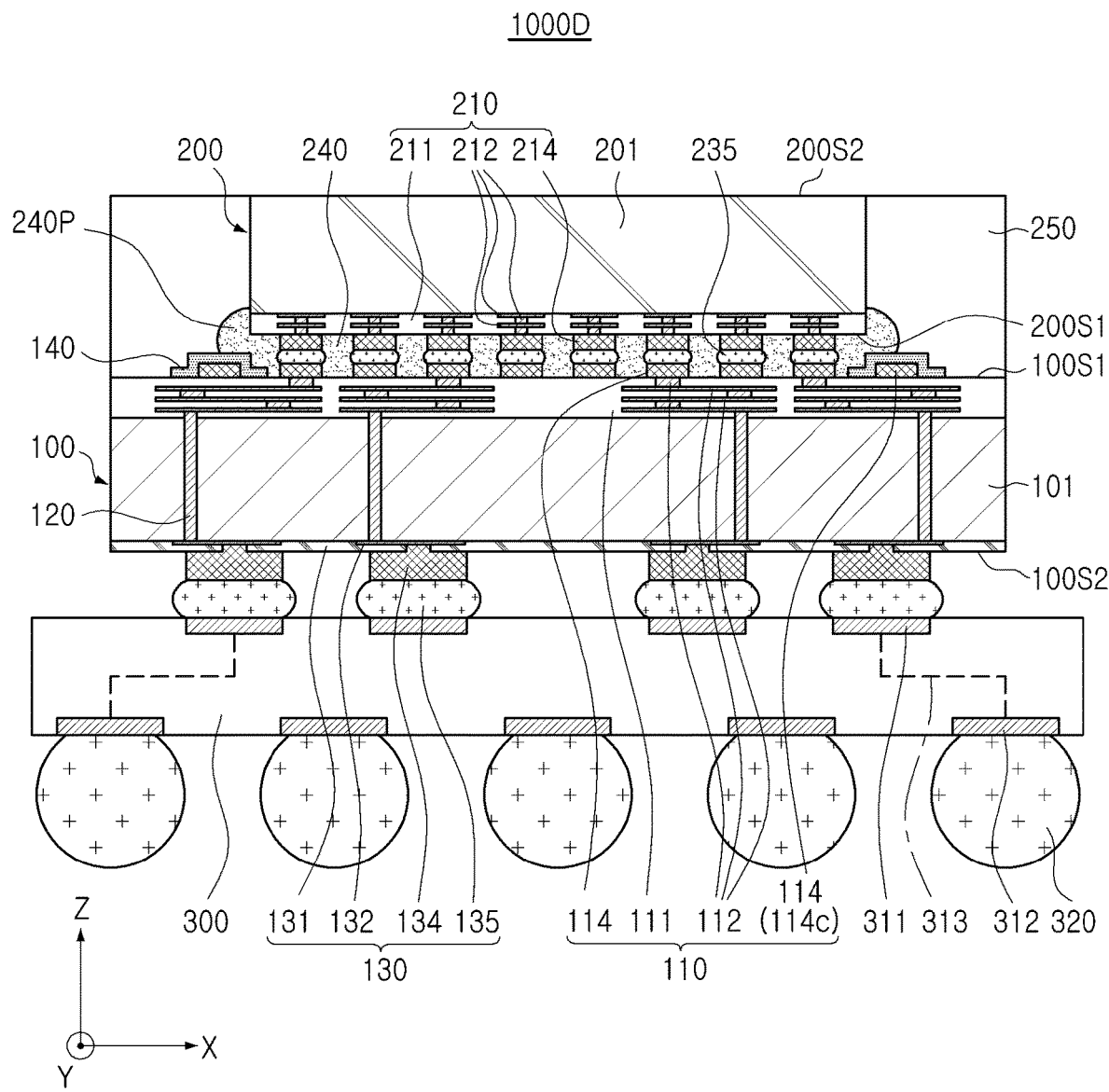
FIG. 7 is a schematic cross-sectional view of a semiconductor package according to an embodiment of the present inventive concept.

FIG. 7 is a schematic cross-sectional view of a semiconductor package according to an embodiment of the present inventive concept.

Referring to FIG. 7, a semiconductor package 1000D may have the same or similar characteristics as those described with reference to FIGS. 1 to 3A, except that the semiconductor package 1000D further includes a package substrate 300 on which a first semiconductor chip 100 is mounted.

As an example, the first semiconductor chip 100 may be, for example, a logic chip including a central processor (CPU), a graphics processor (GPU), a field programmable gate array (FPGA), an application processor (AP), a digital signal processor (DSP), a cryptographic processor, a microprocessor, a microcontroller, an analog-to-digital converter, an application specific integrated circuit (ASIC), or the like. In addition, a second semiconductor chip 200 may include a memory chip such as a DRAM, an SRAM, a PRAM, an MRAM, an FeRAM, or an RRAM. For example, the second semiconductor chip 200 may include a power management IC (PMIC) chip.

For example, the package substrate 300 may include a lower pad 312 disposed on a lower surface of a body, an upper pad 311 disposed on an upper surface of the body, and a redistribution circuit 313 for electrically connecting the lower pad 312 and the upper pad 311. The package substrate 300 may be a substrate for a semiconductor package including a printed circuit board (PCB), a ceramic substrate, a glass substrate, a tape interconnection board, or the like. The body of the package substrate 300 may include a different material depending on a type of the substrate. For example, when the package substrate 300 is a printed circuit board, the body may be in a form in which a copper clad laminate is additionally stacked, or an interconnection layer is additionally stacked on one surface or both surfaces of the copper clad laminate. A solder resist layer may be respectively formed on lower and upper surfaces of the package substrate 300. The upper and lower pads 311 and 312 and the redistribution circuit 313 may form an electrical path connecting the lower surface and the upper surface of the package substrate 300. An external connection terminal 320 connected to the lower pad 312 may be disposed below the package substrate 300. The external connection terminal 320 may be formed of a conductive material having a shape such as a ball shape, a pin shape, or the like.

Figure 8:
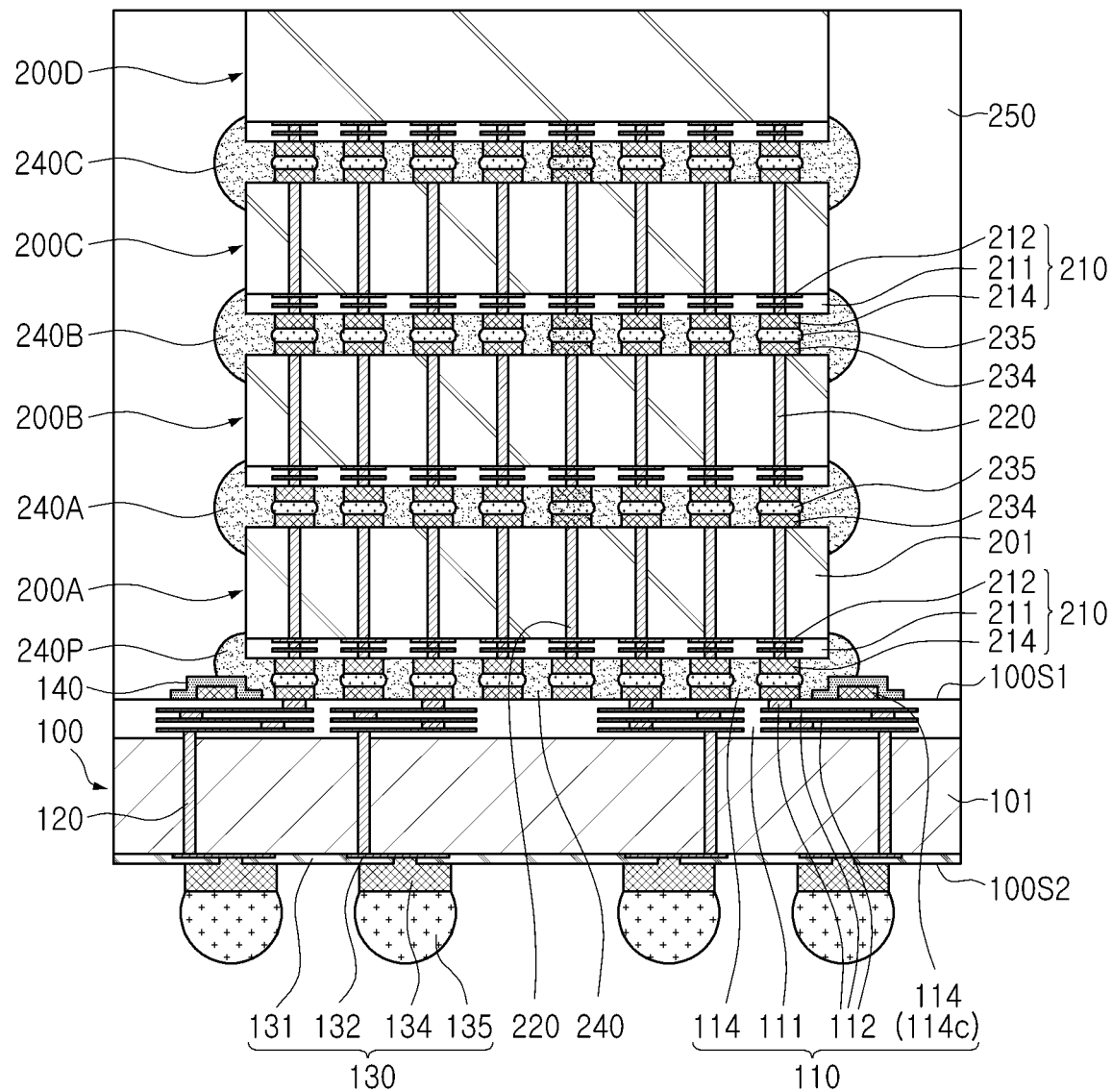
FIG. 8 is a schematic cross-sectional view of a semiconductor package according to an embodiment of the present inventive concept.

FIG. 8 is a schematic cross-sectional view of a semiconductor package according to an embodiment of the present inventive concept.

Referring to FIG. 8, a semiconductor package 1000E may have the same or similar characteristics as those described with reference to FIGS. 1 to 3A, except that a second semiconductor chip on a first semiconductor chip 100 is provided as a plurality of second semiconductor chips 200A, 200B, 200C, and 200D. An encapsulant 250 may expose an upper surface of an uppermost second semiconductor chip 200D, but may also cover the upper surface of the uppermost second semiconductor chip 200D, according to an embodiment. The number of the plurality of second semiconductor chips 200A, 200B, 200C, and 200D is not necessarily limited to that illustrated in the drawings, and may be, for example, two, three, five, or more.

The plurality of second semiconductor chips 200A, 200B, 200C, and 200D may be disposed on the first semiconductor chip 100. Among the plurality of second semiconductor chips 200A, 200B, 200C, and 200D, remaining semiconductor chips, except for the uppermost second semiconductor chip 200D, may further include a second through-via 220 and third connection pads 234. The plurality of second semiconductor chips 200A, 200B, 200C, and 200D may be electrically connected to each other by connection bumps 235 disposed between second connection pads 214 and the third connection pads 234. According to embodiments, the connection bumps 235 may be omitted, and the second connection pad 214 and the third connection pad 234 may be in direct contact with and be bonded to each other. The second through-via 220 may have similar characteristics to a first through-via 120, and to the extent that a detailed description of an element has been omitted, it may be assumed that the element is at least similar to a corresponding element that has been described elsewhere within the present disclosure.

For example, the first semiconductor chip 100 may be a buffer chip including a plurality of logic devices and/or a plurality of memory devices. Therefore, signals from the plurality of second semiconductor chips 200A, 200B, 200C, and 200D stacked on the first semiconductor chip 100 may be transferred to an external source, and a signal and power from the external source may be transmitted to the plurality of second semiconductor chips 200A, 200B, 200C, and 200D. The semiconductor chip 100 may perform a logic function and a memory function together by the logic devices and the memory devices. According to an embodiment, the logic functions may be performed by including the logic devices. The plurality of second semiconductor chips 200A, 200B, 200C, and 200D may include, for example, volatile memory devices such as a DRAM and an SRAM, or non-volatile memory devices such as a PRAM, an MRAM, an FeRAM, or an RRAM. For example, the semiconductor package 1000E of the present embodiment may be used in a high bandwidth memory (HBM) product, an electro data processing (EDP) product, or the like.

Figure 9:
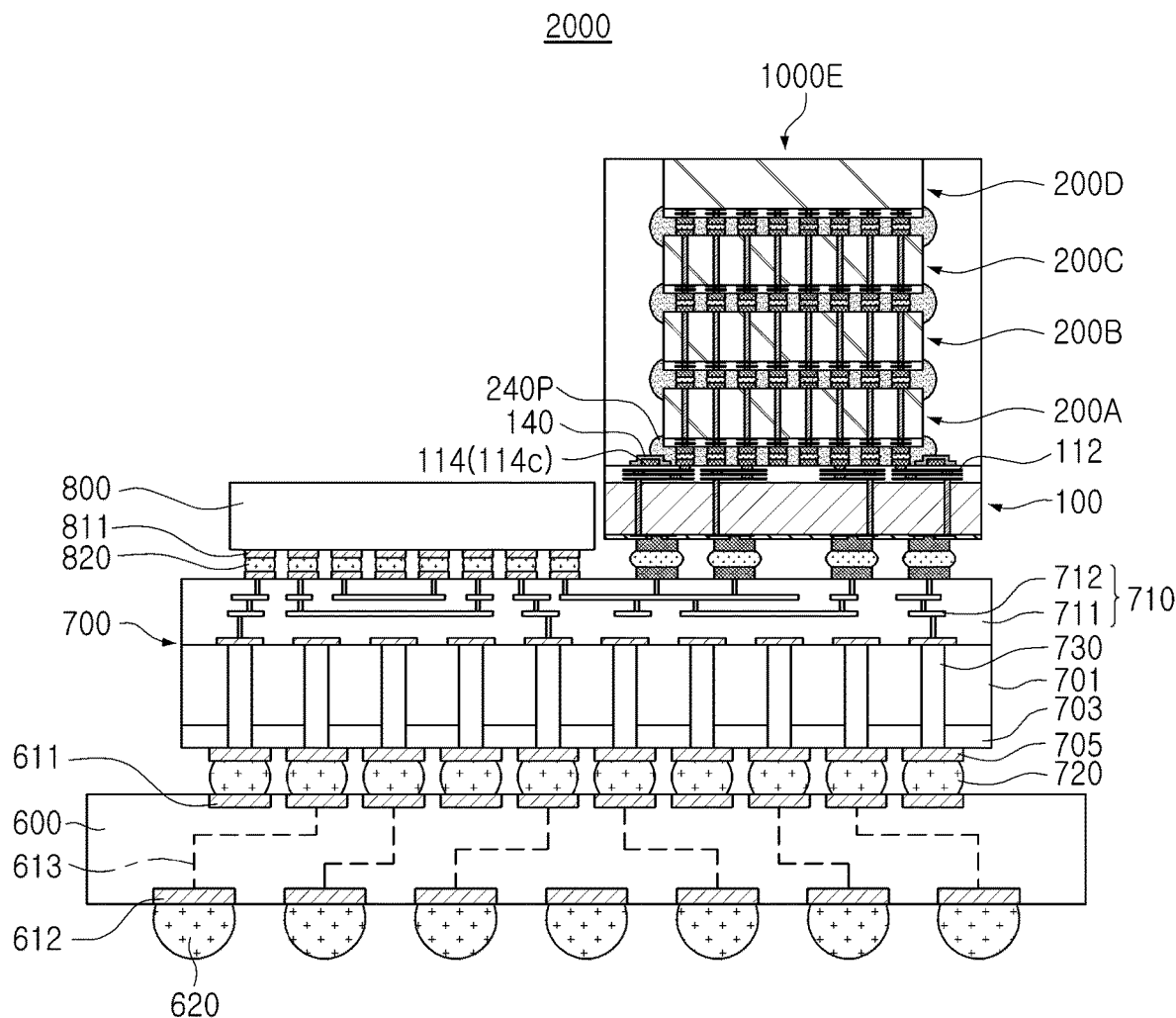
FIG. 9 is a schematic cross-sectional view of a semiconductor package according to an embodiment of the present inventive concept.

FIG. 9 is a schematic cross-sectional view of a semiconductor package according to an embodiment of the present inventive concept.

Referring to FIG. 9, a semiconductor package 2000, according to an embodiment, may include a package substrate 600, an interposer substrate 700, and at least one chip structure 1000E (e.g., the semiconductor package of FIG. 8). Also, the semiconductor package 2000 may further include a logic chip and/or a processor chip 800 disposed adjacent to the chip structure 1000E and on the interposer substrate 700.

The package substrate 600 may include a lower pad 612 disposed on a lower surface of a body, an upper pad 611 disposed on an upper surface of the body, and a redistribution circuit 613 electrically connecting the lower pad 612 and the upper pad 611 to each other. The package substrate 600 may be a support substrate on which the interposer substrate 700, the logic chip 800, and the chip structure 1000E are mounted, and may be a substrate for a semiconductor package including a printed circuit board (PCB), a ceramic substrate, a glass substrate, a tape interconnection board, or the like. The body of the package substrate 600 may include a different material depending on a type of the substrate. For example, when the package substrate 600 is a printed circuit board, the body may be in a form in which a copper clad laminate is additionally stacked, or an interconnection layer is additionally stacked on one surface or both surfaces of the copper clad laminate. A solder resist layer may be respectively formed on lower and upper surfaces of the package substrate 600. The lower and upper pads 612 and 611 and the redistribution circuit 613 may form an electrical path connecting the lower surface and the upper surface of the package substrate 600. The lower and upper pads 612 and 611 and the redistribution circuit 613 may be formed of a metal material, for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), and/or zinc (Zn), and may also include carbon (C), or the lower and upper pads 612 and 611 may include an alloy comprising two or more of the above-listed materials. The redistribution circuit 613 may include multiple redistribution layers, and vias connecting the multiple redistribution layers. An external connection terminal 620 connected to the lower pad 612 may be disposed on a lower surface of the package substrate 600. The external connection terminal 620 may include tin (Sn), indium (In), bismuth (Bi), antimony (Sb), copper (Cu), silver (Ag), zinc (Zn), lead (Pb) and/or or an alloy thereof.

The interposer substrate 700 may include a substrate 701, a lower protective layer 703, a lower pad 705, an interconnection structure 710, a metal bump 720, and a through-via 730. The chip structure 1000E and the processor chip 800 may be stacked on the package substrate 600 via the interposer substrate 700. The interposer substrate 700 may electrically connect the chip structure 1000E and the processor chip 800 to each other.

The substrate 701 may be formed of, for example, an organic material, a plastic, and/or a glass substrate. When the substrate 701 is a silicon substrate, the interposer substrate 700 may be referred to as a silicon interposer. Also, when the substrate 701 is an organic substrate, the interposer substrate 700 may be referred to as a panel interposer.

The lower protective layer 703 may be disposed on a lower surface of the substrate 701, and the lower pad 705 may be disposed on the lower protective layer 703. The lower pad 705 may be connected to the through-via 730. The chip structure 1000E and the processor chip 800 may be electrically connected to the package substrate 600 through the metal bumps 720 disposed on the lower pad 705.

The interconnection structure 710 may be disposed on an upper surface of the substrate 701, and may include an interlayer insulating layer 711, and a single-layer or multi-layer interconnection structure 712. When the interconnection structure 710 has a multi-layered interconnection structure, interconnection patterns of different layers may be connected to each other through a contact via.

The through-via 730 may extend from the upper surface to the lower surface of the substrate 701, and may pass through the substrate 701. In addition, the through-via 730 may extend into the interconnection structure 710, and may be electrically connected to interconnections of the interconnection structure 710. When the substrate 701 is a silicon substrate, the through-via 730 may be referred to as a TSV. Other structures and materials of the through-via 730 may be the same as those described for the semiconductor package 1000 of FIG. 1. According to an embodiment, the interposer substrate 700 may include only an interconnection structure therein, but might not include a through-via.

The interposer substrate 700 may be used for the purpose of converting or transferring an input electrical signal between the package substrate 600 and the chip structure 1000E or the processor chip 800. Therefore, the interposer substrate 700 might not include devices such as active devices or passive devices. Also, according to an embodiment, the interconnection structure 710 may be disposed below the through-via 730. For example, a positional relationship between the interconnection structure 710 and the through-via 730 may be relative.

The metal bump 720 may be disposed on the lower surface of the interposer substrate 700, and may be electrically connected to an interconnection of the interconnection structure 710. The interposer substrate 700 may be stacked on the package substrate 600 through the metal bump 720. The metal bump 720 may be connected to the lower pad 705 through interconnections of the interconnection structure 710 and the through-via 730. In an example, since pads 705 used for power or ground, among the lower pads 705, may be integrated and connected to the metal bump 720, the number of the lower pads 705 may be greater than the number of the metal bumps 720.

Figure 10A:
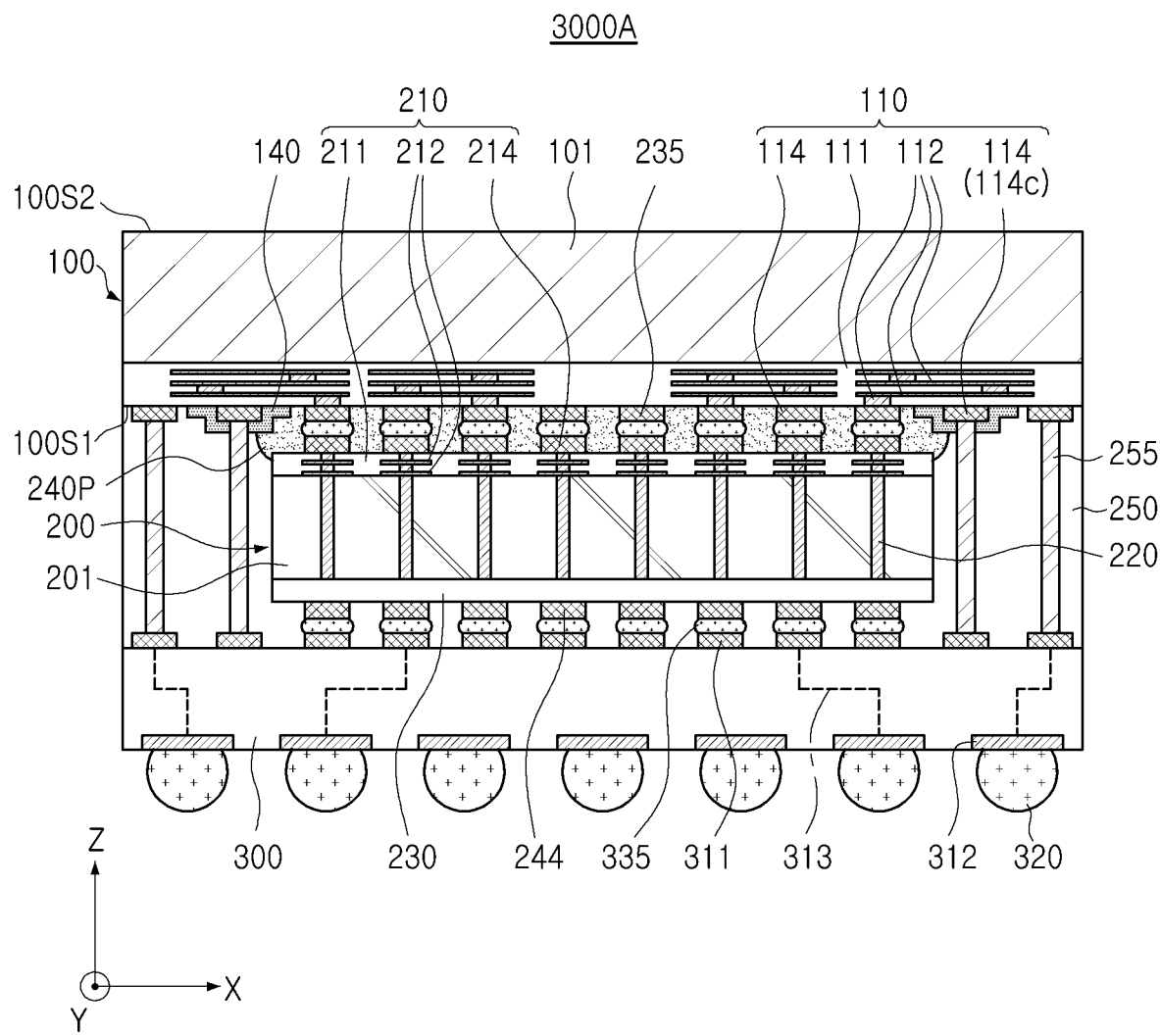
FIGS. 10A and 10B are schematic cross-sectional views of a semiconductor package according to an embodiment of the present inventive concept.
Figure 10B:
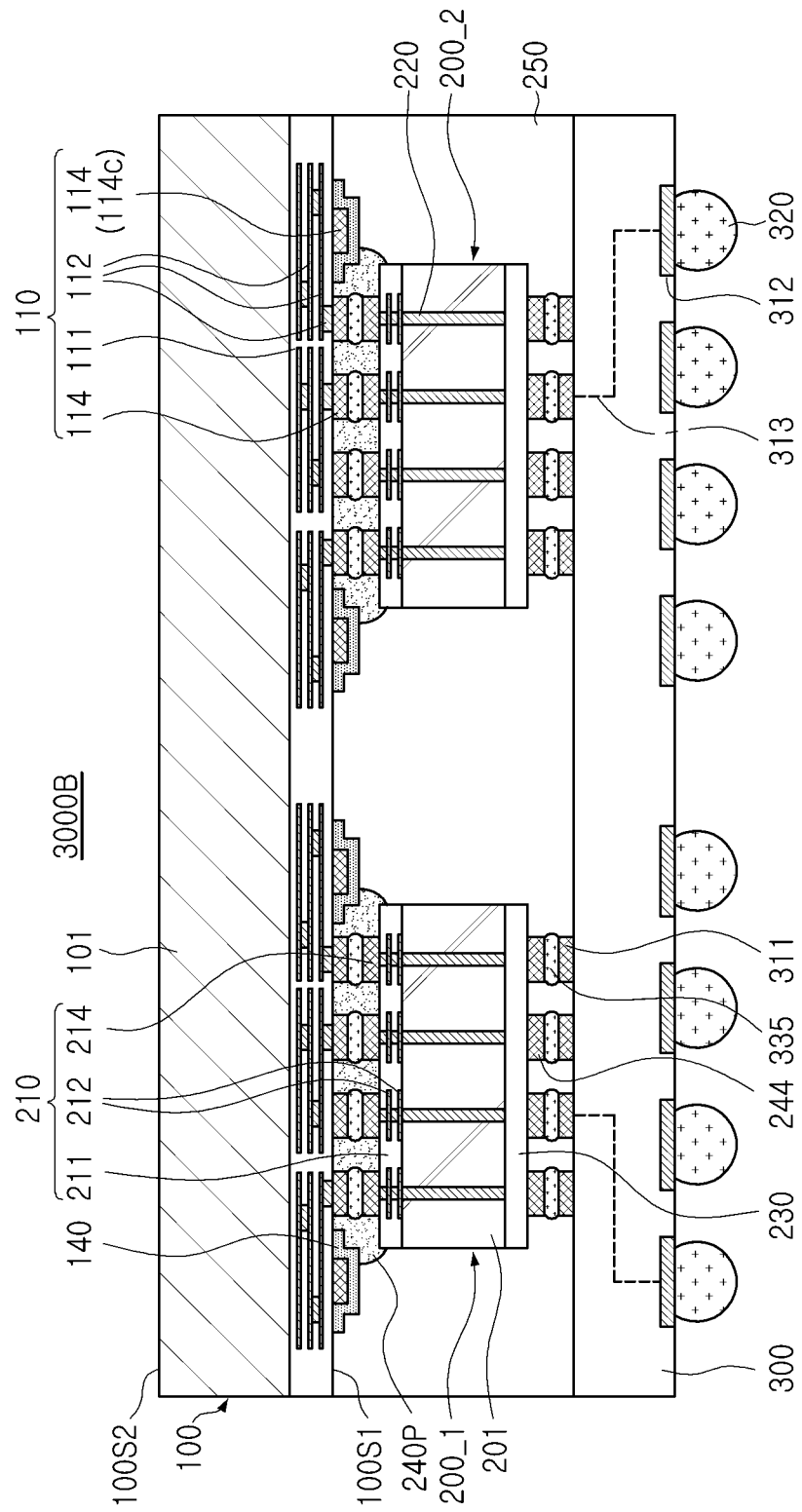

FIGS. 10A and 10B are schematic cross-sectional views of a semiconductor package according to an embodiment of the present inventive concept.

Referring to FIG. 10A, a semiconductor package 3000A may include a first semiconductor chip 100 and a second semiconductor chip 200 on a package substrate 300. A width of the first semiconductor chip 100 may be wider than a width of the second semiconductor chip 200. A chip stack structure of the first semiconductor chip 100 and the second semiconductor chip 200 may be formed by stacking and dicing the semiconductor chips using a chip-on-wafer method and mounting them on the package substrate 300 in an inverted state. For example, the chip stack structure may be mounted by fixing the second semiconductor chip 200 on a semiconductor wafer ('100W' of FIG. 11) including the first semiconductor chip 100, and turning upside down the first semiconductor chip 100, formed by dicing the semiconductor wafer, on the package substrate 300, e.g., such that the second semiconductor chip 200 faces an upper surface of the package substrate 300. For example, the first semiconductor chip 100 may be disposed on the second semiconductor chip 200, based on the package substrate 300. A front surface 100S1 of the first semiconductor chip 100 may face the upper surface of the package substrate 300.

A barrier structure 140 may be disposed on the first surface 100S1 of the first semiconductor chip 100 to separate a portion of first connection pads 114 (e.g., a first connection pad 114c) from a fillet portion 240P of the adhesive layer 240. Therefore, it is possible to prevent a crack defect from occurring in a first interlayer insulating layer 111 or a first interconnection structure 112 of a first device layer 110 of the first semiconductor chip 100.

The first semiconductor chip 100 may include a first semiconductor layer 101 and a first device layer 110, and unlike the previous embodiments, a first through-via 120 and a first connection structure 130 might not be included. The second semiconductor chip 200 may include a second semiconductor layer 201, a second device layer 210, a second through-via 220, and a second back surface layer 230. The second through-via 220 may be a through silicon via (TSV), may pass through the second semiconductor layer 201 in the vertical direction (the Z-axis direction) to provide an electrical path connecting a second interconnection structure 212 of the second device layer 210 and the second back surface layer 230. The second back surface layer 230 may include an insulating protective layer, and may include an interconnection structure electrically connecting the second through-via 220 and fourth connection pads 244. The fourth connection pads 244 may be electrically connected to each other through upper pads 311 and connection bumps 335.

In addition, the semiconductor package 3000A may extend onto the package substrate 300 in the vertical direction (the Z-axis direction), and may further include vertical connection structures 255 electrically connecting a portion of the upper pads 311 of the package substrate 300 and a portion of first connection pads 114. The vertical connection structures 255 may pass through an encapsulant 250. A portion of the vertical connection structures 255 may pass through the barrier structure 140 and may be connected to a portion of the first connection pads 114. The vertical connection structures 255 may include, for example, a metal post.

Referring to FIG. 10B, a semiconductor package 3000B may include a plurality of second semiconductor chips 200_1 and 200_2 between a first semiconductor chip 100 and a package substrate 300. In an embodiment of FIG. 10B, similar to the embodiment of FIG. 10A, a chip stack structure may be mounted by fixing the second semiconductor chips 200_1 and 200_2 on a semiconductor wafer including the first semiconductor chip 100, and turning upside down the first semiconductor chip 100, formed by dicing the semiconductor wafer, for example the two second semiconductor chips 200_1 and 200_2 as a unit, on the package substrate 300, e.g., such that the second semiconductor chips 200_1 and 200_2 face an upper surface of the package substrate 300, respectively.

FIGS. 11 to 15 are cross-sectional views sequentially illustrating a process of manufacturing a semiconductor package according to an embodiment of the present inventive concept.

Figure 11:
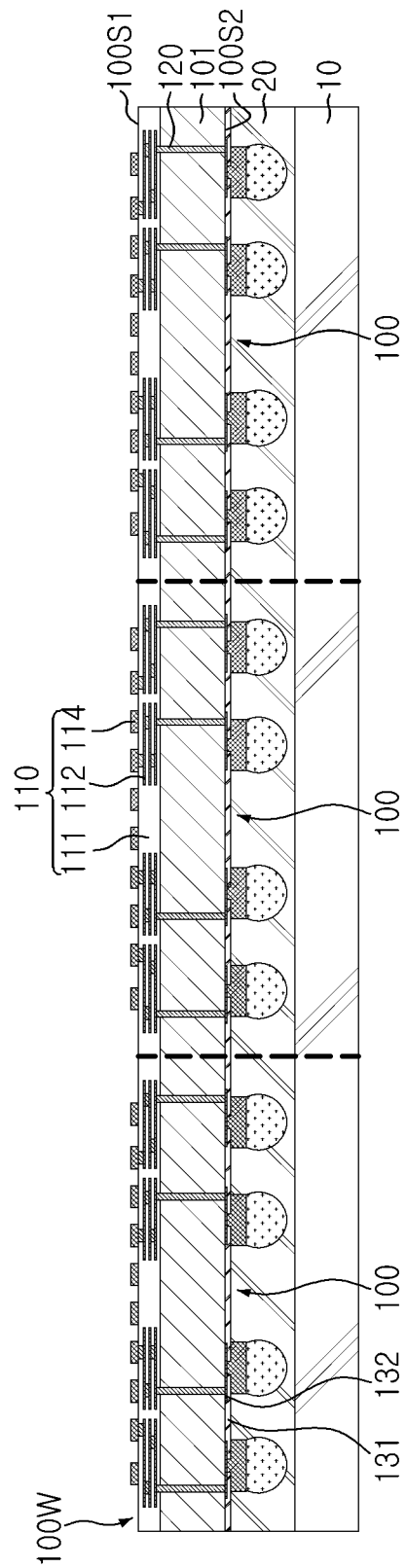
FIGS. 11 to 15 are cross-sectional views sequentially illustrating a process of manufacturing a semiconductor package according to an embodiment of the present inventive concept.

Referring to FIG. 11, first, a semiconductor wafer 100W for first semiconductor chips 100 having a first through-via 120 may be attached to a carrier 10 using an adhesive material layer 20. The semiconductor wafer 100W may be provided in a state in which components for the first semiconductor chips 100 are implemented. The first semiconductor chips 100 may be divided by scribe lanes (illustrated by thick dotted lines) in the semiconductor wafer 100W. The semiconductor wafer 100W may be attached on the carrier 10 such that lower surfaces 100S2 of the first semiconductor chips 100 on which lower connection bumps 135 are disposed face the adhesive material layer 20. The lower connection bumps 135 may be covered by the adhesive material layer 20, and a lower surface of the semiconductor wafer 100W may be in contact with an upper surface of the adhesive material layer 20.

Figure 12:
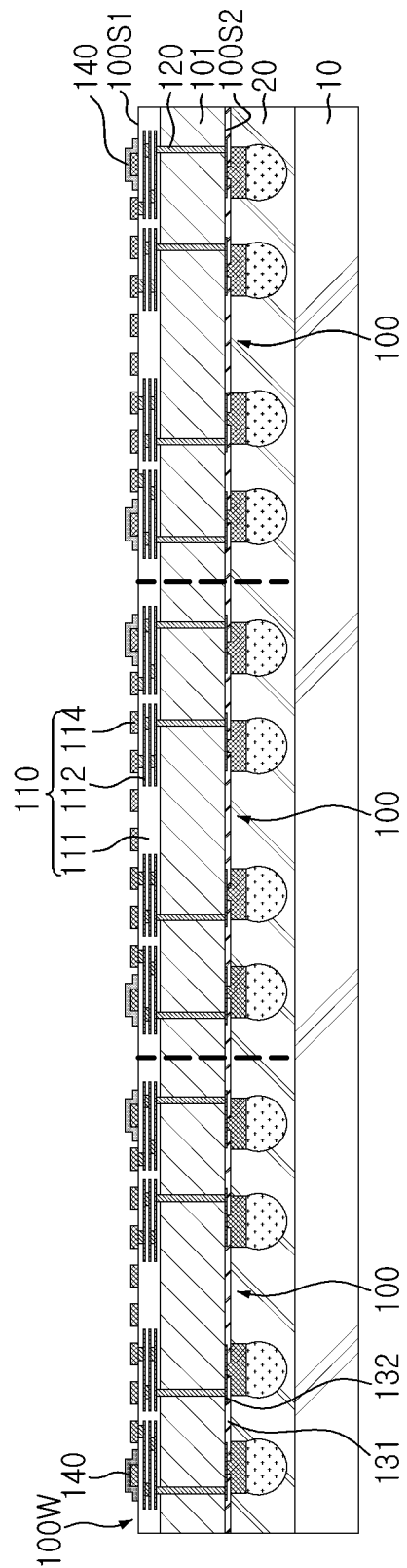

Referring to FIG. 12, a barrier structure 140 may be formed by depositing a barrier layer on the first semiconductor chips 100 on the semiconductor wafer 100W, and performing a photo process and an etching process. The barrier structure 140 may cover a portion of first connection pads 114. The barrier structure 140 may at least partially surround a region requiring crack propagation blocking, for example, a region in which a second semiconductor chip 200 is subsequently mounted.

Figure 13:
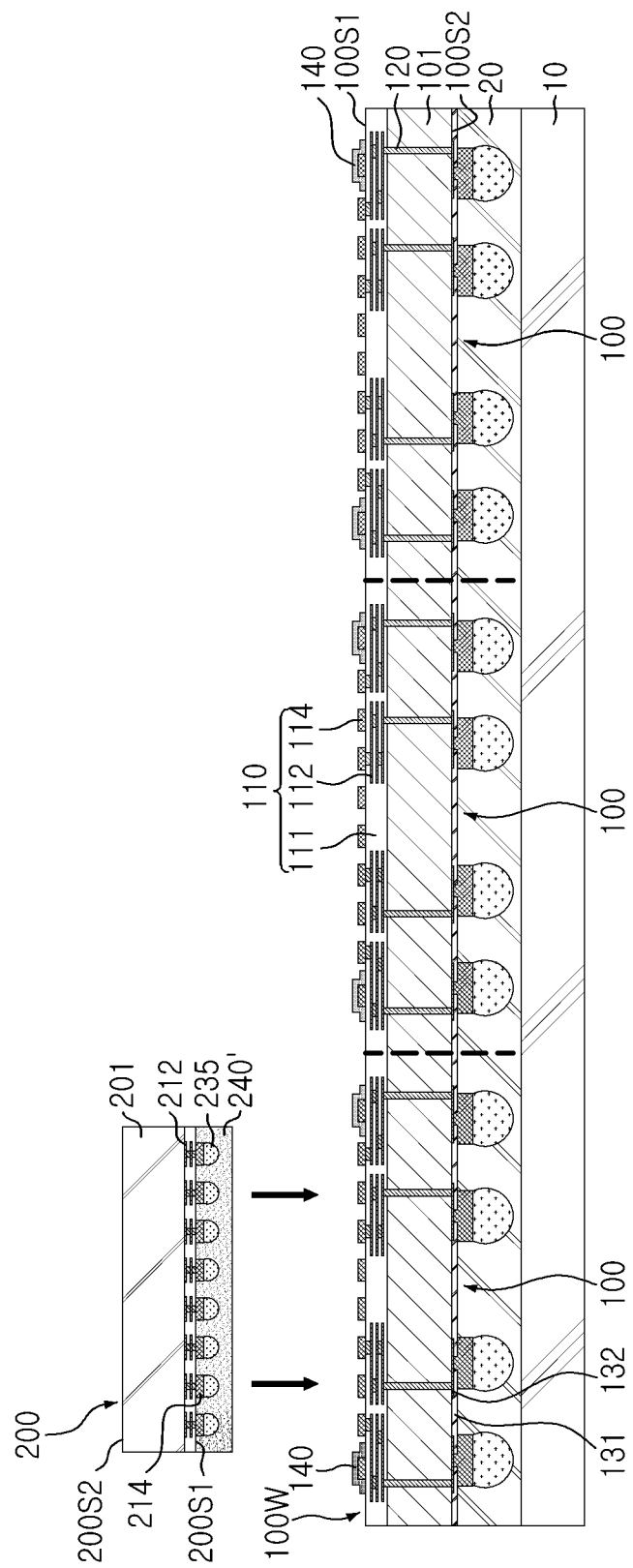

Referring to FIG. 13, a second semiconductor chip 200 may be attached on the is semiconductor wafer 100W. The second semiconductor chip 200 may be in a state in which an adhesive film layer 240' surrounding connection bumps 235 is formed on a lower surface 200S1. The adhesive film layer 240' may completely cover the connection bumps 235, or may expose at least a portion of the connection bumps 235. The second semiconductor chip 200 may be vacuum-adsorbed on an adsorption surface of a bonding device, and picked and placed on the semiconductor wafer 100W. The second semiconductor chip 200 may be attached on the semiconductor wafer 100W such that the lower surface 200S1 adjacent to a second interconnection structure 212 of a second device layer 210 faces the semiconductor wafer 100W.

Figure 14:
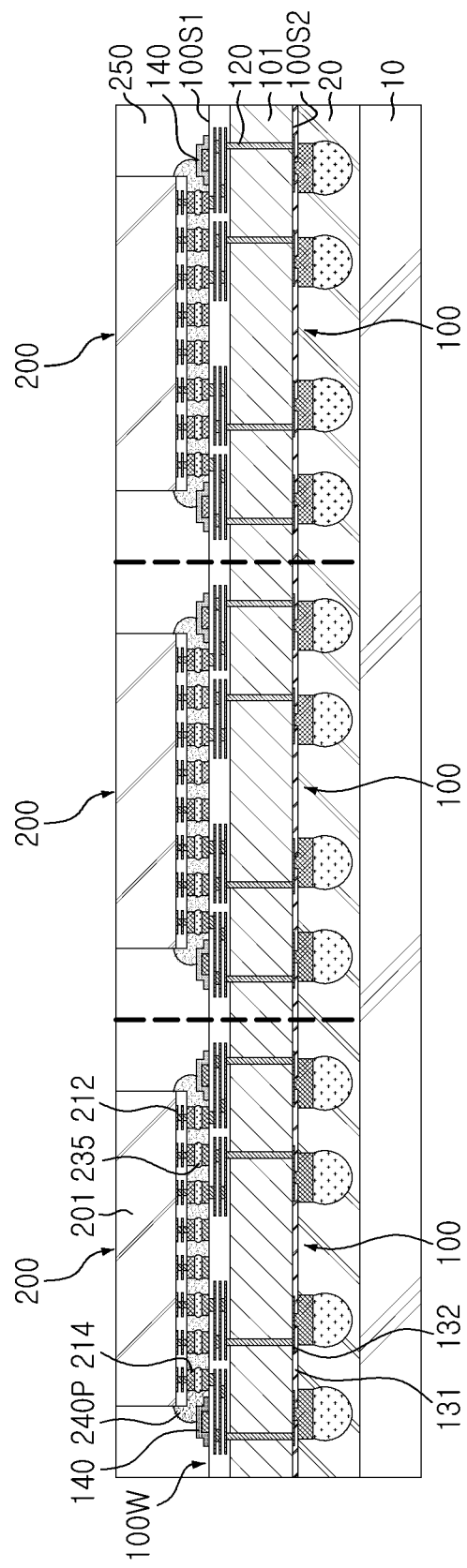

Referring to FIG. 14, the second semiconductor chip 200 may be fixed on the semiconductor wafer 100W by performing a thermocompression process. The thermocompression process may be performed under process conditions (for example, a pressure of thermocompression bonding, an amount of a non-conductive material constituting the adhesive film layer, or the like) to form a fillet portion 240P extending chip in an outward direction, with respect to a side surface of the second semiconductor chip 200, on one end of the adhesive film layer 240'.

Thereafter, an encapsulant 250 may be formed on the semiconductor wafer 100W, a polishing process may be performed, and the encapsulant 250 and the semiconductor wafer 100W may be cut along a scribe line, to separate a plurality of semiconductor packages 1000. The adhesive material layer 20 and carrier 10 may be removed. FIGS. 11 to 14 illustrate a chip-on-wafer packaging method in which the second semiconductor chip 200 is stacked on the semiconductor wafer 100W including the first semiconductor chip 100, but the present inventive concept is not necessarily limited thereto, and may be applicable to a chip-on-chip or wafer-on-wafer packaging method.

Figure 15:
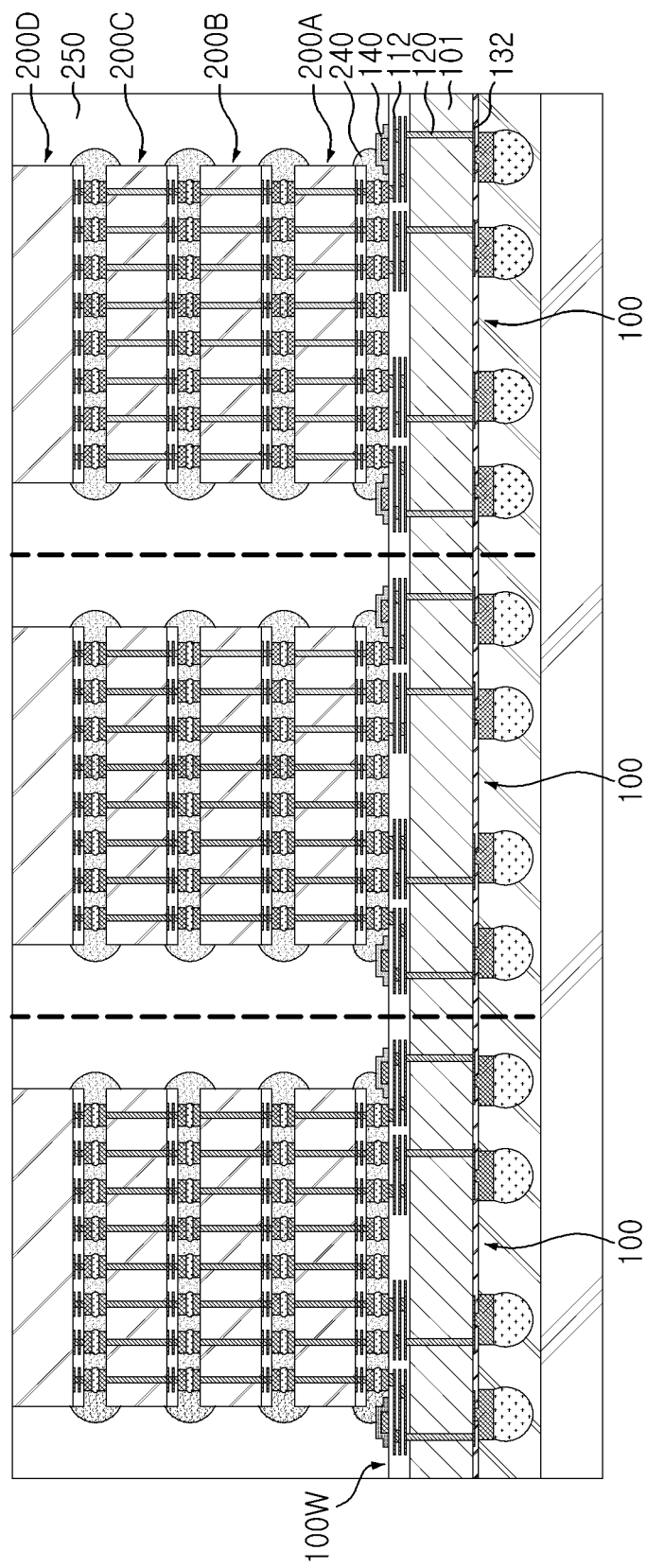

Referring to FIG. 15, a plurality of second semiconductor chips 200A, 200B, 200C, and 200D may be sequentially stacked on the semiconductor wafer 100W, and a thermocompression process may be performed thereon. Adhesive layers 240A, 240B, and 240C disposed between the plurality of second semiconductor chips 200A, 200B, 200C, and 200D may be thermally compressed, to form a fillet portion protruding outward from portions intervening the plurality of second semiconductor chips 200A, 200B, 200C, and 200D. Thereafter, an encapsulant 250 may be formed and a polishing process may be performed, and then the encapsulant 250 and the semiconductor wafer 100W may be cut along a scribe line and may be separated into a plurality of semiconductor packages (1000E in FIG. 8).

According to an embodiment of the present inventive concept, since a barrier structure may be disposed below a fillet portion of an adhesive layer, to prevent cracks from propagating from the fillet portion to an interconnection structure of a lower chip below the barrier structure, a semiconductor package having increased reliability may be provided.

While example embodiments have been illustrated and described above, it will be apparent to those skilled in the art that modifications and variations could be made without departing from the scope of the present inventive concept.

What is claimed is:

1. A semiconductor package, comprising:
a first semiconductor chip having a first surface and a second surface opposite to the first surface, the first semiconductor chip including first connection pads adjacent to the first surface;
a second semiconductor chip having a lower surface facing the first surface of the first semiconductor chip, the second semiconductor chip including second connection pads;
connection bumps contacting the first connection pads and the second connection pads between the first semiconductor chip and the second semiconductor chip;
an adhesive layer interposed between the first semiconductor chip and the second semiconductor chip and at least partially surrounding the connection bumps, the adhesive layer including a protruding portion protruding from a side surface of the second semiconductor chip in an outward direction away from the side surface of the second semiconductor chip; and
a barrier structure at least partially covering one of the first connection pads, at least partially overlapping the second semiconductor chip on the first surface, and contacting the protruding portion of the adhesive layer,
wherein the barrier structure is spaced apart from another one of the first connection pads that is immediately next to the one of the first connection pads.

2. The semiconductor package of claim 1, wherein the barrier structure is spaced apart from the connection bumps.

3. The semiconductor package of claim 1, wherein the first semiconductor chip further comprises:
an interconnection structure adjacent to the first surface and electrically connected to the first connection pads; and
interlayer insulating layers covering the interconnection structure,
wherein the barrier structure at least partially covers an uppermost insulating interlayer among the interlayer insulating layers.

4. The semiconductor package of claim 3, wherein the first semiconductor chip further comprises a first semiconductor layer disposed below the interconnection structure, and first through-vias passing through the first semiconductor layer and electrically connected to the interconnection structure.

5. The semiconductor package of claim 4, wherein the second semiconductor chip further comprises a second semiconductor layer disposed on the second connection pads, and second through-vias passing through the second semiconductor layer and electrically connected to the second connection pads.

6. The semiconductor package of claim 1, wherein the connection bumps are disposed below a central region of the lower surface of the second semiconductor chip, and wherein the barrier structure extends along respective sides of the lower surface of the second semiconductor chip, and at least partially surrounds the central region.

7. The semiconductor package of claim 1, wherein the barrier structure has an outer sidewall and an inner sidewall, and
wherein the outer sidewall of the barrier structure is disposed in the outward direction, with respect to the side surface of the second semiconductor chip.

8. The semiconductor package of claim 7, wherein the outer sidewall of the barrier structure is disposed in the outward direction, with respect to the protruding portion of the adhesive layer.

9. The semiconductor package of claim 7, wherein the outer sidewall of the barrier structure is disposed in an inward direction, with respect to a side surface of the first semiconductor chip.

10. The semiconductor package of claim 7, wherein the inner sidewall of the barrier structure at least partially overlaps the second semiconductor chip.

11. The semiconductor package of claim 1, wherein the barrier structure comprises a photoimageable dielectric (PID) or photo-sensitive polyimide (PSPI).

12. A semiconductor package, comprising:
a first semiconductor chip including a first device layer, wherein the first device layer includes a first interlayer insulating layer, a first interconnection structure, and first connection pads;
a second semiconductor chip having a lower surface facing the first device layer of the first semiconductor chip and including second connection pads;
connection bumps disposed between the first semiconductor chip and the second semiconductor chip and electrically connecting the first connection pads and the second connection pads to each other;
an adhesive layer interposed between the first semiconductor chip and the second semiconductor chip, the adhesive layer at least partially surrounding the connection bumps, and contacting the first device layer; and
a barrier structure contacting the first device layer and the adhesive layer, spaced apart from the connection bumps, and at least partially surrounding regions in which the connection bumps are disposed,
wherein the barrier structure is spaced apart from the regions in which the connection bumps are disposed.

13. The semiconductor package of claim 12, wherein the adhesive layer comprises a protruding portion contacting both an upper surface of the barrier structure and a side surface of the second semiconductor chip.

14. The semiconductor package of claim 13, wherein a first connection pad adjacent to the protruding portion, among the first connection pads, is spaced apart from the protruding portion with the barrier structure disposed therebetween.

15. The semiconductor package of claim 12, wherein the barrier structure comprises barrier patterns extending along respective sides of the lower surface of the second semiconductor chip,
wherein the barrier patterns are spaced apart from each other in a region below a corner of the lower surface of the second semiconductor chip.

16. The semiconductor package of claim 12, wherein one side of the lower surface of the second semiconductor chip has a first length, and
wherein the barrier structure comprises a barrier pattern extending along the one side of the lower surface of the second semiconductor chip and having a second length that is shorter than the first length.

17. The semiconductor package of claim 16, wherein the second length ranges from about 0.8 times to about 0.9 times the first length.

18. The semiconductor package of claim 12, wherein a thickness of the barrier structure ranges from about 1 μm to about 15 μm.

19. A semiconductor package, comprising:
- a first semiconductor chip including a first semiconductor layer, a through-via passing through the first semiconductor layer, a first interconnection structure, and first connection pads disposed on an upper surface of the first semiconductor layer and electrically connected to the through-via;
- a second semiconductor chip disposed on the first semiconductor chip and including a second semiconductor layer, a second interconnection structure, and second connection pads;
- connection bumps contacting the first connection pads and the second connection pads between the first semiconductor chip and the second semiconductor chip;
- an adhesive layer interposed between the first semiconductor chip and the second semiconductor chip and at least partially surrounding the connection bumps, the adhesive layer including a protruding portion protruding from a side surface of the second semiconductor chip in an outward direction away from the side surface of the second semiconductor chip;
- a barrier structure disposed between one of the first connection pads and the protruding portion of the adhesive layer, and including an overlapping region vertically overlapping the second semiconductor chip and a non-overlapping region that does not vertically overlap the second semiconductor chip; and
- an encapsulant at least partially covering the barrier structure, the protruding portion of the adhesive layer, and the second semiconductor chip on the first semiconductor chip,
- wherein the non-overlapping region of the barrier structure extends in the outward direction, with respect to the protruding portion of the adhesive layer,
- wherein the barrier structure is spaced apart from another one of the first connection pads that is immediately next to the one of the first connection pads.

20. The semiconductor package of claim 19, wherein the overlapping region of the barrier structure is spaced apart from the connection bumps, and
wherein the non-overlapping region of the barrier structure is in contact with the protruding portion of the adhesive layer.

* * * * *